(12) United States Patent
Fukuoka

(10) Patent No.: US 7,139,194 B2
(45) Date of Patent: Nov. 21, 2006

(54) NONVOLATILE SEMICONDUCTOR MEMORY

(75) Inventor: Ikuto Fukuoka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/168,450

(22) Filed: Jun. 29, 2005

(65) Prior Publication Data

US 2005/0237799 A1    Oct. 27, 2005

Related U.S. Application Data

(63) Continuation of application No. PCT/JP03/07069, filed on Jun. 4, 2003.

(51) Int. Cl.
*G11C 7/10* (2006.01)
*G11C 7/06* (2006.01)
*G11C 5/06* (2006.01)

(52) U.S. Cl. ............... 365/185.05; 365/185.06; 365/185.07; 365/185.17; 365/72

(58) Field of Classification Search ........... 365/185.05, 365/185.06, 185.07, 72
See application file for complete search history.

(56) References Cited

U.S. PATENT DOCUMENTS 5,610,858 A * 3/1997 Iwahashi ............ 365/185.23
5,671,177 A    9/1997 Ueki
5,760,437 A * 6/1998 Shimoji .............. 257/316
6,768,683 B1 * 7/2004 Fastow et al. ......... 365/185.33
6,984,863 B1 * 1/2006 Miida ................. 257/368

FOREIGN PATENT DOCUMENTS

| JP | 06-061505 | 3/1994 |
| JP | 08-036889 | 2/1996 |
| JP | 8-36894 | 2/1996 |
| JP | 08-279295 | 10/1996 |
| JP | 09-306185 | 11/1997 |

* cited by examiner

*Primary Examiner*—Amir Zarabian
*Assistant Examiner*—Ly Duy Pham
(74) *Attorney, Agent, or Firm*—Arent Fox PLLC

(57) ABSTRACT

Each nonvolatile memory cell transistor has such directivities that a current flows only from the drain to the source and that charge is exchangeable only at the source. The source of one of a pair of memory cell transistors connected to each word line is connected to the drain of the other memory cell transistor, and the drain of the one memory cell transistor is connected to the source of the other. During a data rewrite operation, reverse voltages are applied to the sources and drains of the pair of memory cell transistors. Because of the directivities of each memory cell transistor, charge is exchanged with a charge accumulation layer only in the source region. This makes the data rewritable in only one of the pair of memory cell transistors. As a result, data is rewritable on a memory cell basis without increasing the memory cell size.

10 Claims, 11 Drawing Sheets

| operation for MC21 | memory cell | gate G | drain D | source S |
|---|---|---|---|---|
| erase | MC21 | −9V (WL2) | 0V (BL1) | 5V (BL0) |
| | MC20 | −9V (WL2) | 5V (BL0) | 0V (BL1) |
| | MC22 | −9V (WL2) | 0V (BL2) | 0V (BL3) |
| | MC11,31,... | 0V (WL1,3,...) | 0V (BL1) | 5V (BL0) |
| | MC10,30,... | 0V (WL1,3,...) | 5V (BL0) | 0V (BL1) |
| write | MC21 | 9V (WL2) | 5V (BL1) | 0V (BL0) |
| | MC20 | 9V (WL2) | 0V (BL1) | 5V (BL1) |
| | MC22 | 9V (WL2) | 0V (BL2) | 0V (BL3) |
| | MC11,31,... | 0V (WL1,3,...) | 5V (BL1) | 0V (BL0) |
| | MC10,30,... | 0V (WL1,3,...) | 0V (BL0) | 5V (BL1) |
| read | MC21 | 5V (WL2) | 1V (BL1) | 0V (BL0) |
| | MC20 | 5V (WL2) | 0V (BL0) | 1V (BL1) |
| | MC22 | 5V (WL2) | 0V (BL2) | 0V (BL3) |
| | MC11,31,... | 0V (WL1,3,...) | 1V (BL1) | 0V (BL0) |
| | MC10,30,... | 0V (WL1,3,...) | 0V (BL0) | 1V (BL1) |

Fig. 8

NONVOLATILE SEMICONDUCTOR MEMORY

CROSS REFERENCE TO RELATED APPLICATION

This application is a continuation application of International Application PCT/JP 03/07069, filed Jun. 4, 2003, and designating the U.S.

BACKGROUND OF THE INVENTION

1. Field of the Invention

The present invention relates to a nonvolatile semiconductor memory.

2. Description of the Related Art

Nonvolatile semiconductor memories such as EEPROMs store data by injecting electrons into a charge accumulation layer of a memory cell and thereby changing the threshold voltage of the memory cell. In general, a state that the threshold voltage is high and no current flows through the memory cell during a read operation is a state that data "0" has been written (0-state, programmed state), and a state that the threshold voltage is low and a current flows through the memory cell during a read operation is a state that data "1" has been written (1-state, erased state). A 0-state or a 1-state is detected by comparing a current (memory cell current) that flows through the memory cell during a read operation with a reference current that flows through a reference memory cell. The outline of this kind of nonvolatile semiconductor memory is disclosed in Japanese Unexamined Patent Application Publication No. 6-61505, for example.

In general byte-rewrite-type EEPROMs, data can be written or erased on a memory cell basis. However, in EEPROMs, a select gate (select transistor) needs to be provided for each memory cell to connect a gate line (word line) and a bit line to the control gate of each memory cell. As a result, the memory cell area is large and hence EEPROMs are not suitable for large-capacity storage.

On the other hand, flash memories have been developed in which the memory cell area can be reduced though the unit of data rewriting is increased. Flash memories do not have select gates and each word line is connected to the control gates of plural memory cells together. Each source line is wired so as to be common to each of blocks that are a unit of rewriting. In flash memories, an erase operation is performed on a block-by-block basis or a full-chip basis. In general flash memories, the minimum unit of erasure (block size) is about 8 Kbytes.

Although flash memories of the above kind enable construction of a large-capacity memory, they have a disadvantage that data cannot be rewritten on a memory cell basis. As such, flash memories of the above kind are restricted in use.

In general, not all memory cells have the same characteristic. Therefore, even if the same electric field is applied to memory cells, resulting threshold voltage variations are not identical. That is, charge exchange rates vary. In flash memories, data of the memory cells in a block are erased together. Therefore, if a memory cell that is high in the tendency to release electrons from a charge accumulation layer exists in a block, the threshold voltage of that memory cell becomes negative (over-erased cell) during an erase operation.

FIG. 1 shows an attempt to read data from a memory cell that is connected to the same bit line as an over-erased cell is connected to. This example is directed to a NOR-type flash memory.

In the figure, electrons are accumulated in the floating gate of a memory cell MC1 as a result of a write operation and a logical value "0" is stored there. Memory cells MC2 and MC3 store a logical value "1" because electrons have been released from their floating gates as a result of an erase operation. Because of a high charge exchange rate, the threshold voltage of the memory cell MC2 is made negative (over-erased cell) as a result of the preceding erase operation.

To read data from the memory cell MC1, a high voltage "H" is supplied to a word line WL1 that is connected to the memory cell MC1 and a low voltage "L" (e.g., ground potential) is supplied to word lines WL2 and WL3 that are connected to the other memory cells MC2 and MC3. The ground voltage is supplied to a source line SL.

If the threshold voltages of the memory cells MC1–MC3 were set at correct values, no current would flow from a bit line BL to the source line SL even if the voltage of the word line WL1 is set at the high voltage "H." Therefore, it could be judged as a result of the read operation that a logical value "0" is stored in the memory cell MC1. However, since the memory cell MC2 is in the over-erased state, a current flows from the bit line BL to the source line SL via the memory cell MC2 even if the gate voltage of the memory cell MC2 is 0 V. As a result, it is judged that a logical value "1" is stored in the memory cell MC1. That is, the presence of the over-erased cell causes incorrect data reading.

One measure for preventing over-erasure is to manage the threshold voltage of each memory cell so that it is set higher than usual in an erased state. However, in this case, the difference between a threshold voltage of a memory cell in an erased state and that of the memory cell in a written state is decreased. This lowers the read margin.

Another measure for preventing over-erasure is to apply erasing voltages plural times in a divisional manner. Threshold voltage variations are reduced and an event that many memory cells are rendered in an over-erased state at one time is thereby prevented. A measure for enabling an easy recovery from an over-erased state even in the event of the over-erasure is also taken. However, in this case, the erase time is increased.

SUMMARY OF THE INVENTION

An object of the present invention is to make it possible to erase data on a memory cell basis without increasing the memory cell area.

Another object of the invention is to increase the data read margin and thereby prevent incorrect data reading.

In one aspect of nonvolatile semiconductor memory according to the invention, nonvolatile memory cell transistors are arranged in matrix form. Each memory cell transistor has such directivities that a current flows only from the drain to the source and charge is exchangeable only at the source. Control gate groups of memory cell transistors arranged in one direction are connected to respective word lines.

A first bit line is connected to a source of one of a pair of memory cell transistors and to a drain of the other of the memory cell transistors that are adjacent to each other and connected to one of the word lines. The drain of the one memory cell transistor and the source of the other memory cell transistor are connected to a second bit line. That is, the source and the drain of the one memory cell transistor are connected to the drain and the source of the other memory cell transistor, respectively. With this structure, during an operation of rewriting data held in a memory cell transistor, reverse voltages are always applied to the sources and drains of the pair of memory cell transistors. Because of the directivities of each memory cell transistor, charge is exchanged with a charge accumulation layer only in the source region. This makes it possible to rewrite the data in only one of a pair of memory cell transistors connected to the same word line. As a result, data is rewritable on a memory cell basis without the need for increasing the memory cell size.

For example, erasing data on a memory cell basis can set an optimum erased state for each memory cell in an erase operation. For storing data logical values as threshold values of memory cells, for example, it is possible to narrow the range of distribution of threshold voltages in the erased state. This makes it possible to increase differences between the threshold voltages in the erased state and a read reference voltage and to thereby increase the read margin. This can prevent incorrect data reading.

In another aspect of nonvolatile semiconductor memory according to the invention, memory cell transistors connected to each of the word lines have the drains arranged such that the drains are directed to the same side. The memory cell transistors arranged in the direction perpendicular to the word lines have the drains and the sources arranged alternately such that they are directed to reverse sides. The first and second bit lines are wired in a twisted pair form in the direction perpendicular to the word lines.

Symmetrically orienting adjoining memory cell transistors arranged in the direction perpendicular to the word lines makes it possible to connect adjoining drains to a common node and also to connect adjoining sources to a common node. As a result, the first and second bit lines can easily be wired in a twisted pair form by merely connecting those to the individual nodes. In general, in a read operation of a nonvolatile semiconductor memory, the voltage of the source is fixed to a ground voltage or the like and a logical value is judged in accordance with the value of a current flowing through a memory cell transistor. As a result, the formation of twisted-pair bit lines makes it possible to protect, from external noise, data to be read out to a bit line.

In another aspect of nonvolatile semiconductor memory according to the invention, the first and second bit lines are wired by using a first wiring layer and a second wiring layer. And, the first and second wiring layers are switched at a drain node to which drains facing each other are connected and a source node to which sources facing each other are connected. Each one of the drain nodes and the source nodes is formed alternately between memory cell transistors that are arranged in the direction perpendicular to the word lines. This makes it possible to wire the first and second bit lines in a twisted pair easily and efficiently.

In another aspect of nonvolatile semiconductor memory according to the invention, the memory cell transistors connected to each of the word lines have drains arranged such that the drains are directed to a same side. The memory cell transistors arranged in the direction perpendicular to the word lines have the drains and sources of arranged alternately such that the drains and sources are directed to reverse sides. The first and second bit lines are wired in a zigzag in the direction perpendicular to the word lines.

Symmetrically orienting adjoining memory cells arranged in the direction perpendicular to the word lines makes it possible to connect adjoining drains to a common node and also to connect adjoining sources to a common node. As a result, the first and second bit lines can easily be wired in a zigzag merely by connecting those to the individual nodes. It is not necessary to cross the first and second bit lines. As a result, the first and second bit lines can be wired simply.

In still another aspect of nonvolatile semiconductor memory according to the invention, the first and second bit lines are wired by using only a first wiring layer. Wiring the first and second bit lines in a zigzag makes it possible to minimize the number of wiring layers used. As a result, the chip cost can be reduced.

In another aspect of nonvolatile semiconductor memory according to the invention, in an erase operation for erasing data stored in a memory cell transistor, an erase control circuit sets the threshold voltage of the memory cell transistor at a negative value and then at a predetermined positive value indicating an erased state.

Since an erase operation can be performed without the need for taking a proper measure against over-erasure, the erase operation time can be reduced. More specifically, the memory cell transistor is caused to positively go into an over-erased state, and it is not necessary that the memory cell transistor is caused to gradually go into an erased state. What is called stepwise erasure is not necessary.

In another aspect of nonvolatile semiconductor memory according to the invention, each memory cell transistor can be given the directivity easily by forming an offset region between the drain and a control gate of each memory cell transistor.

In yet another aspect of nonvolatile semiconductor memory according the invention, a refresh control circuit performs, in response to a refresh request, a refresh operation which is an operation for reading data held in a memory cell transistor and rewriting the read data. The refresh operation prevents data held in a memory cell transistor from being lost due to a disturbance that is caused by an access to an adjacent memory cell transistor. According to the invention, a refresh operation can be performed easily because an erase operation can be performed on a memory cell transistor basis. In contrast, full-chip-erase-type nonvolatile semiconductor memories require a large buffer for a refresh operation.

In another aspect of nonvolatile semiconductor memory according to the invention, a refresh request circuit issues a refresh request in accordance with the number of times the memory cell transistor is accessed. Performing a refresh operation for every predetermined number of accesses makes it possible to reliably prevent loss of data held in the memory cell transistor.

In a further aspect of nonvolatile semiconductor memory according to the invention, an access counter counts the number of times the memory cell transistor is accessed. The use of the access counter makes it possible to easily perform a refresh operation for every predetermined number of accesses.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 8 is a table showing voltages that are applied to memory cells in an erase operation, a write operation, and a read operation;

DESCRIPTION OF THE PREFERRED EMBODIMENTS

Figure 1:
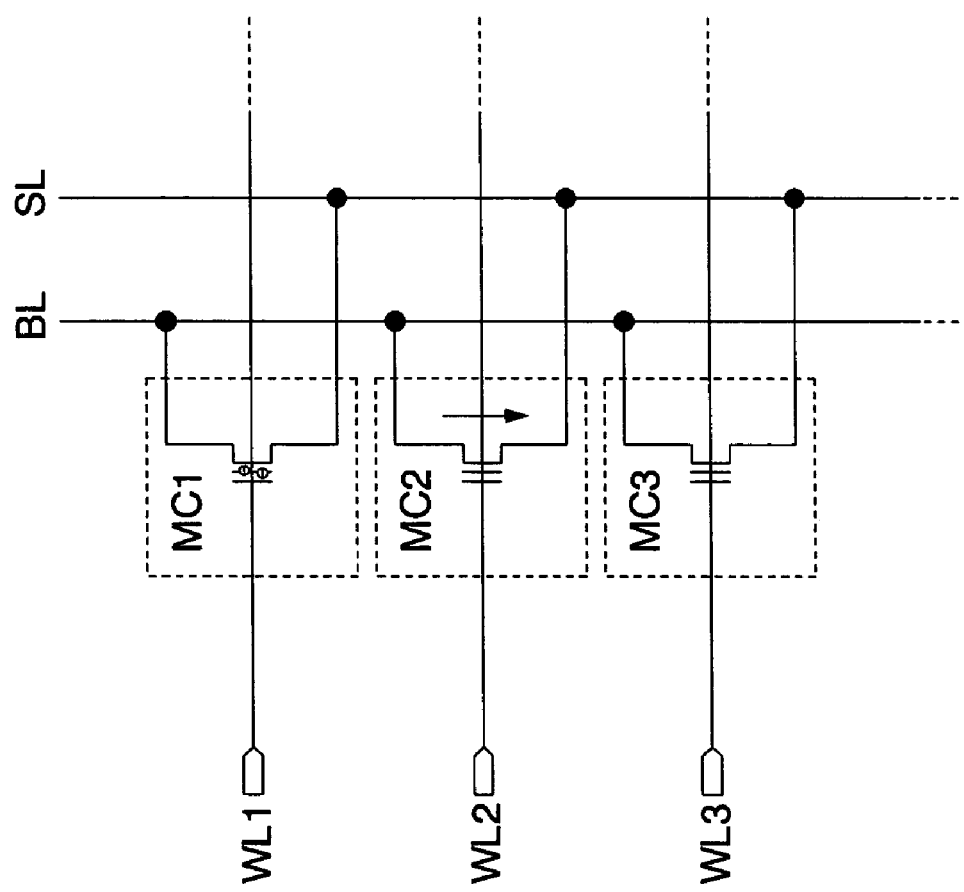
FIG. 1 is a circuit diagram showing problems that arise in the case where an over-erased cell exists.

Embodiments of the present invention will be hereinafter described with reference to the drawings. Double circles in the drawings represent external terminals. In the drawings, each signal line that is drawn as a thick line consists of plural lines. Part of blocks to which thick lines are connected consist of plural circuits. Each signal that is supplied via an external terminal is denoted by a symbol that is the same as a terminal name. Each signal line that transmits a signal is denoted by a symbol that is the same as a signal name.

Figure 2:
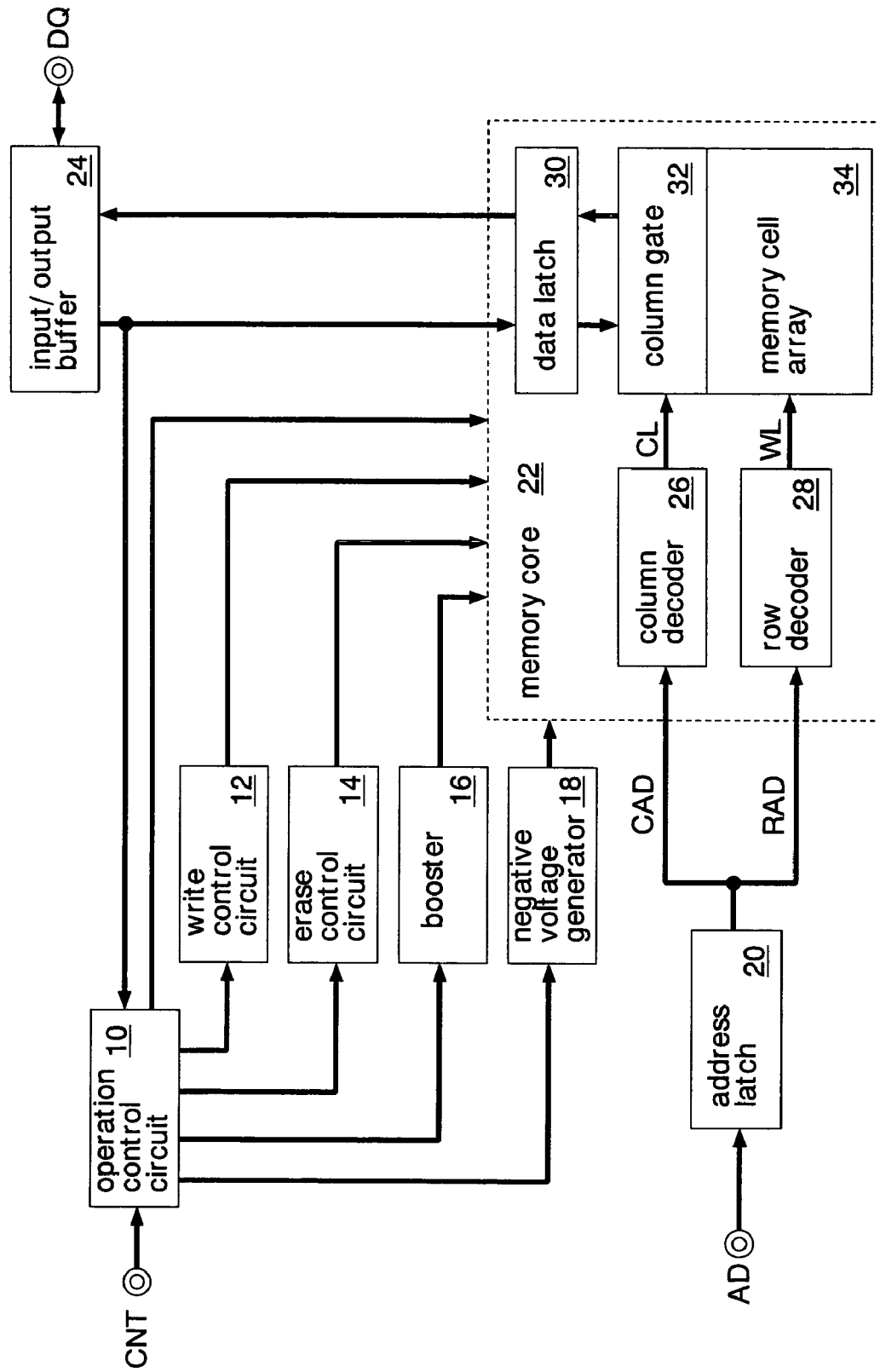
FIG. 2 is a block diagram of a nonvolatile semiconductor memory according to a first embodiment of the invention.

FIG. 2 shows a nonvolatile semiconductor memory according to a first embodiment of the invention. This nonvolatile semiconductor memory is a NOR-type EEPROM core that is incorporated in a system LSI. The system LSI is formed on a silicon substrate by a CMOS process and has a CPU and a RAM in addition to the EEPROM.

The EEPROM has an operation control circuit 10, a write control circuit 12, an erase control circuit 14, a booster 16, a negative voltage generator 18, an address latch 20, a memory core 22, and an input/output buffer 24. The memory core 22 has a column decoder 26, a row decoder 28, a data latch 30, a column gate 32, and a memory cell array 34.

The operation control circuit 10 receives a control signal CNT (chip enable signal, write enable signal, output enable signal, or the like) that is supplied via a control terminal CNT or a command signal that is supplied via a data terminal DQ and generates, in accordance with the received signal, a control signal for causing a read operation, a write operation (program operation), or an erase operation.

The write control circuit 12, which operates when receiving an instruction of a write operation from the operation control circuit 10, outputs a control signal for causing the memory core 22 to perform the write operation. The erase control circuit 14, which operates when receiving an instruction of an erase operation from the operation control circuit 10, outputs a control signal for causing the memory core 22 to perform the erase operation.

The booster 16, which operates in response to a control signal from the operation control circuit 10, generates a boosted voltage using a power supply voltage. The boosted voltage serves as, for example, a voltage to be supplied to word lines WL (described later). The negative voltage generator 18, which operates in response to a control signal from the operation control circuit 10, generates a negative voltage using the power supply voltage.

The generated negative voltage serves as, for example, a voltage to be supplied to the word lines WL (described later).

The address latch 20 latches an address signal AD that is supplied via an address terminal AD and outputs a latched address as a row address signal RAD and a column address signal CAD. The row address signal RAD consists of upper bits of the address signal AD and the column address signal CAD consists of lower bits of the address signal AD.

The input/output buffer 24 receives a command signal via the data terminal DQ and outputs the received command signal to the operation control circuit 10. The input/output buffer 24 receives write data from the data terminal DQ and outputs read-out data to the data terminal DQ.

The column decoder 26 decodes a column address signal CAD and selects one column select signal CL in accordance with the column address signal CAD. The row decoder 28 decodes a row address signal RAD and selects one word line WL in accordance with the row address signal RAD. The voltage of the selected word line WL is set at a predetermined voltage in accordance with an operation mode. For example, the voltage of the word line WL is set at −9 V during an erase operation, at 9 V during a write operation, and at 5 V during a read operation. These voltages are generated by the negative voltage generator 18 and the booster 16 by using the power supply voltage (e.g., 3 V).

The data latch 30 latches data that are read from the memory cell array 34 or data to be written to the memory cell array 34 that are supplied via the data terminal DQ. The column gate 32 has column switches (not shown) that are turned on selectively in accordance with a column selection signal CL. When the column switch is turned on, a corresponding bit line of the memory cell array 34 is connected to the data latch 30.

Figure 3:
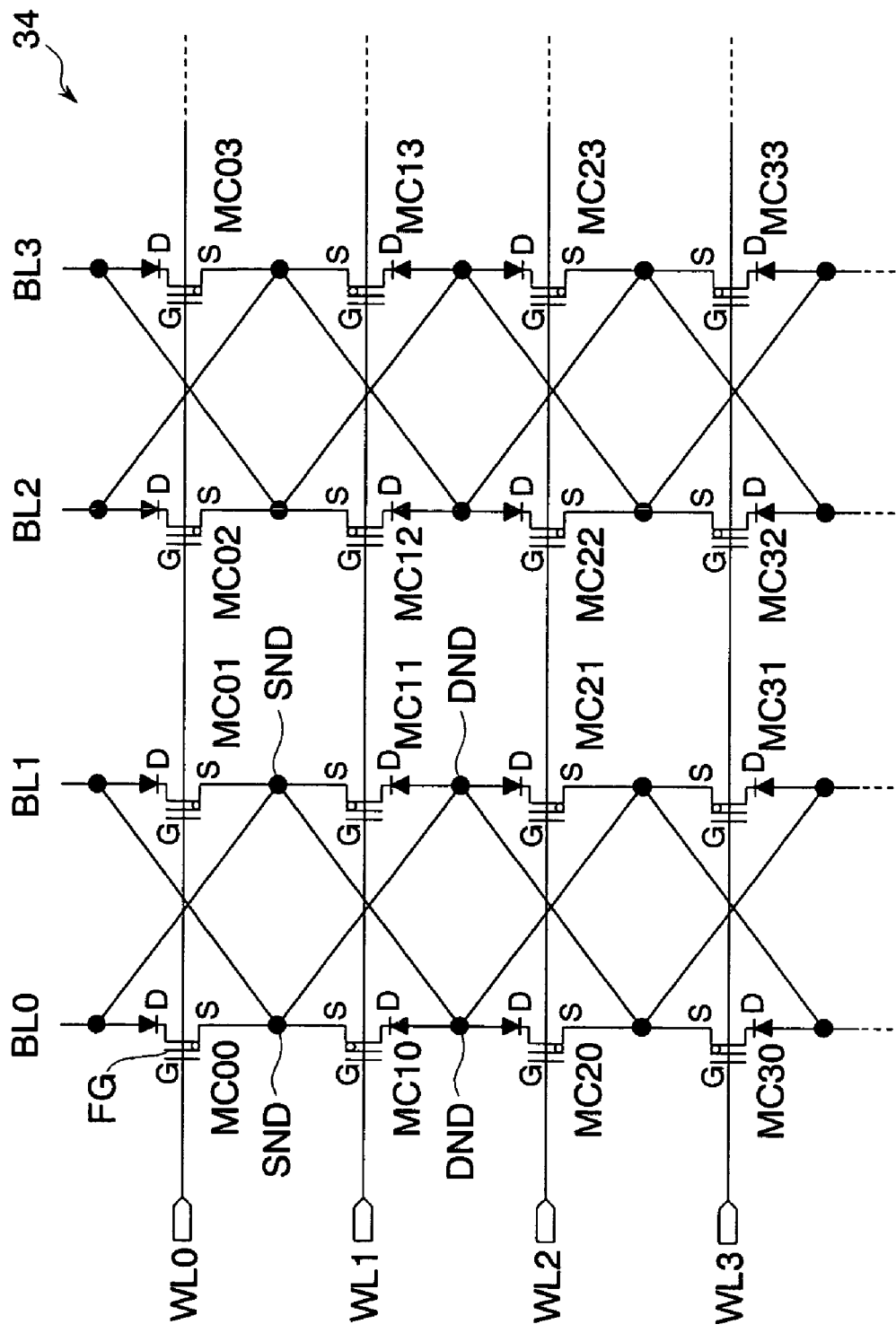
FIG. 3 is a circuit diagram showing the details of a memory cell array shown in FIG. 2.

FIG. 3 shows the details of the memory cell array 34 shown in FIG. 2.

The memory cell array 34 has plural nonvolatile memory cells MC (MC00, MC01, MC02, . . . ) that are arranged in matrix form, word lines WL that are connected to the control gates G of the memory cells MC, and bit lines BL (BL00, BL01, . . . ) that are connected to the drains D and the sources S of the memory cells MC. The word lines WL are wired so as to extend in the horizontal direction in the figure and the bit lines BL are wired so as to extend in the vertical direction in the figure.

Each memory cell MC is a transistor (memory cell transistor) having a floating gate FG in which to accumulate charge. The floating gate FG is formed by a conductive film of polysilicon or the like. Each memory cell MC has such directivity that a current is allowed to flow only from the drain D to the source S. Therefore, in the figure, a diode is connected to the drain D in a sense of equivalence. A circle between the floating gate FG and the source S indicates a charge exchange position. Having the current directivity, each memory cell MC allows charge input/output with respect to the floating gate FG only at the charge exchange position shown in the figure. In this embodiment, each memory cell MC operates as an electrically rewritable binary memory cell.

The drains D of memory cells MC whose control gates G are connected to each of the word lines WL (WL0, WL1, . . . ) (i.e., memory cells MC arranged in the horizontal direction in the figure) are oriented in the same direction. For example, the drains D of the memory cells MC00, MC01, . . . that are connected to the word line WL0 are located above in the figure and the drains D of the memory cells MC10, MC11, . . . that are connected to the word line WL1 are located below.

In memory cells MC (e.g., memory cells MC00, MC10, MC20) that are arranged in the direction perpendicular to the word lines WL (i.e., in the vertical direction in the figure), the drains D and the sources S are located alternately. The sources S of memory cells MC adjacent to each other in the vertical direction are connected to each other via a source node SND, and the drains D of memory cells MC adjacent to each other in the vertical direction are connected to each other via a drain node DND.

The bit lines BL (BL0, BL1, . . . ), which are wired in a twisted pair form, are connected to the source nodes SND and the drain nodes DND. More specifically, pay attention to a pair of adjoining memory cells (e.g., MC10 and MC11) that are connected to one word line WL (e.g., word line WL1). The bit line BL1 (first bit line) is connected to the source S of the one memory cell MC10 and the drain D of the other memory cell MC11. The bit line BL0 (second bit line) is connected to the drain D of the one memory cell MC10 and the source S of the other memory cell MC11. Symmetrically orienting adjoining memory cells MC arranged in the vertical direction makes it possible to connect the drains D and the sources S to the common nodes DND and SND, respectively. As a result, the bit lines BL can easily be wired in a twisted pair form merely by connecting those to the individual nodes.

Figure 4:
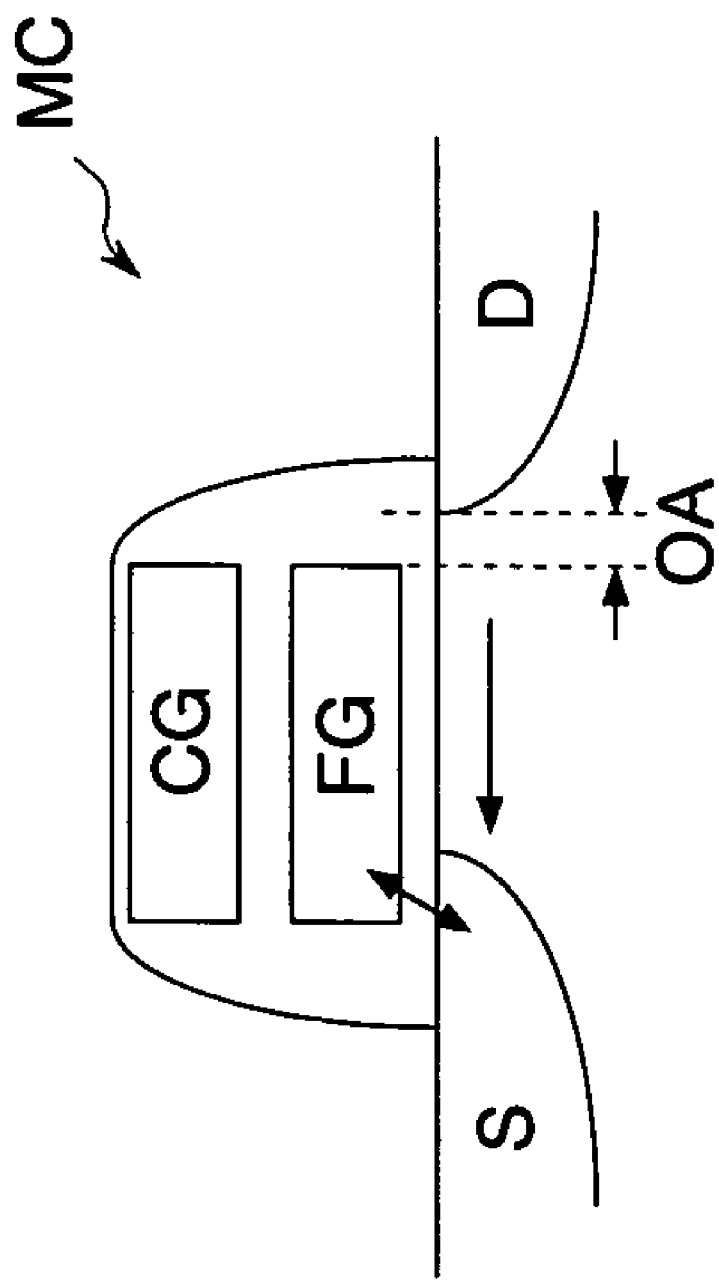
FIG. 4 is a sectional view showing the structure of each memory cell shown in FIG. 3.

FIG. 4 shows the structure of each memory cell MC shown in FIG. 3.

In the memory cell MC, to realize the above-described current directivity, an offset region OA is formed between the drain D and the floating gate FG. In contrast, the source S and the floating gate FG overlap with each other.

The offset structure is formed by implanting ions for formation of the drains D after forming side walls on both sides of the floating gate FG and then performing heat treatment. The source S is formed by implanting ions immediately after forming the control gate CG and the floating gate FG by etching and then performing heat treatment. The offset structure makes it possible to easily realize the directivity that a current is allowed to flow only from the drain D to the source S as well as the localization that electrons in the floating gate FG can be exchanged only with the source region S.

Figure 5:
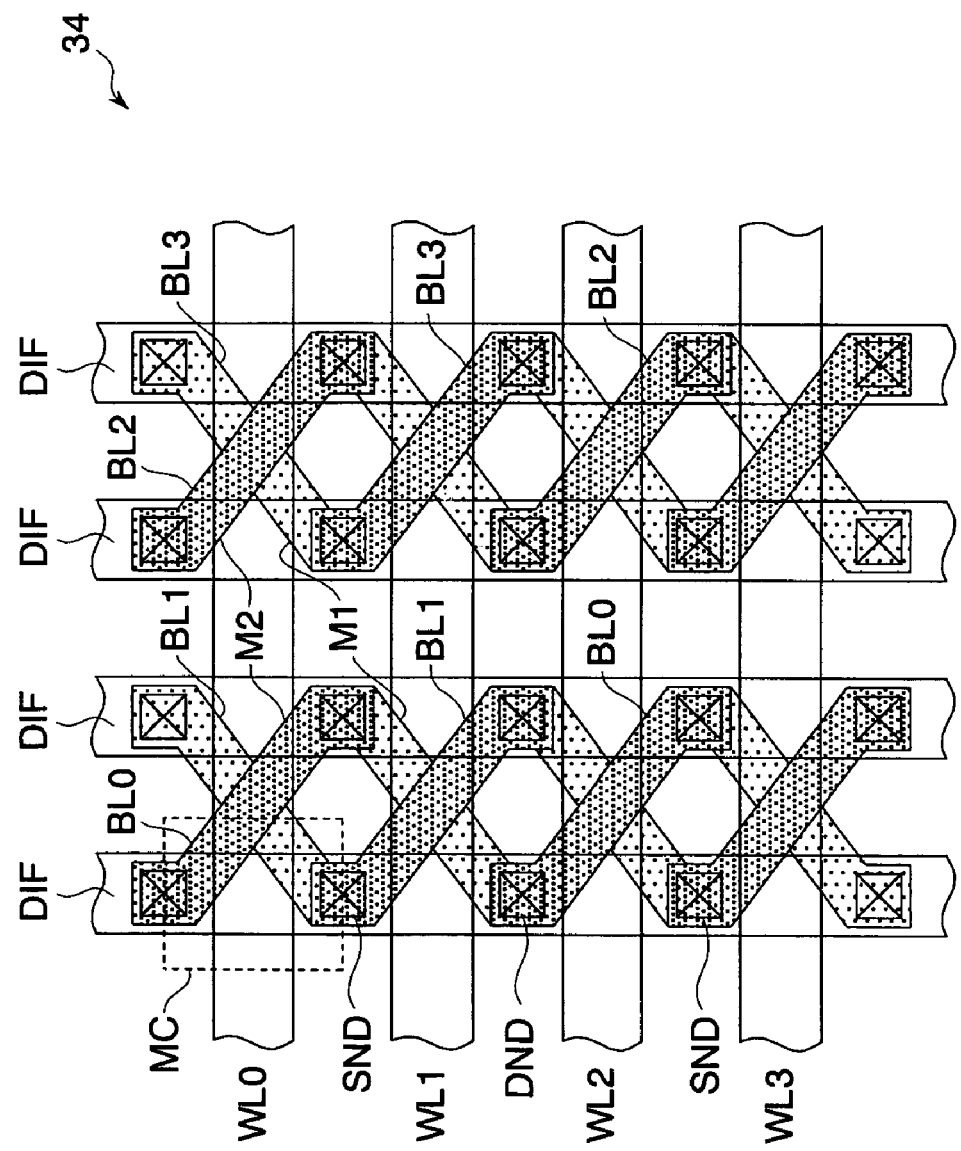
FIG. 5 is a wiring layout diagram of the memory cell array of FIG. 3.

FIG. 5 shows a wiring layout of the memory cell array 34 of FIG. 3.

Band-shaped diffusion regions DIF are formed in the vertical direction in the figure. The source S and the drains D of the memory cells MC are formed by parts of the diffusion regions DIF that are not covered with the word lines WL (WL0, WL1, . . . ). Squares that are marked with "X" in the figure represent contact regions that connect first and second metal wiring layers M1 and M2 to the diffusion layers DIF. The contact regions also correspond to the source nodes SND that connect the sources S of memory cells MC that are adjacent to each other in the vertical direction in the figure or the drain nodes DND that connect the drains D of memory cells MC that are adjacent to each other in the vertical direction in the figure.

The bit lines BL (BL0, BL1, . . . ) are wired in a twisted pair form by using the first metal wiring layers M1 and the second metal wiring layers M2. The wiring lines of the bit lines BL are switched at the contact regions (drain nodes DND and source nodes SND). Connecting each bit line BL to a drain node DND and a source node SND alternately makes it possible to form a twisted-pair structure easily and efficiently.

As described later, during a read operation, one of the voltages of adjoining bit lines BL (e.g., bit lines BL0 and BL1) is set at a predetermined voltage and the other is set at the ground voltage (0 V). Therefore, by virtue of its shield effect, forming adjoining bit lines BL as a twisted pair makes it possible to make the memory cell array 34 less prone to external noise. An EEPROM that is high in noise resistance can thus be constructed.

Figure 6:
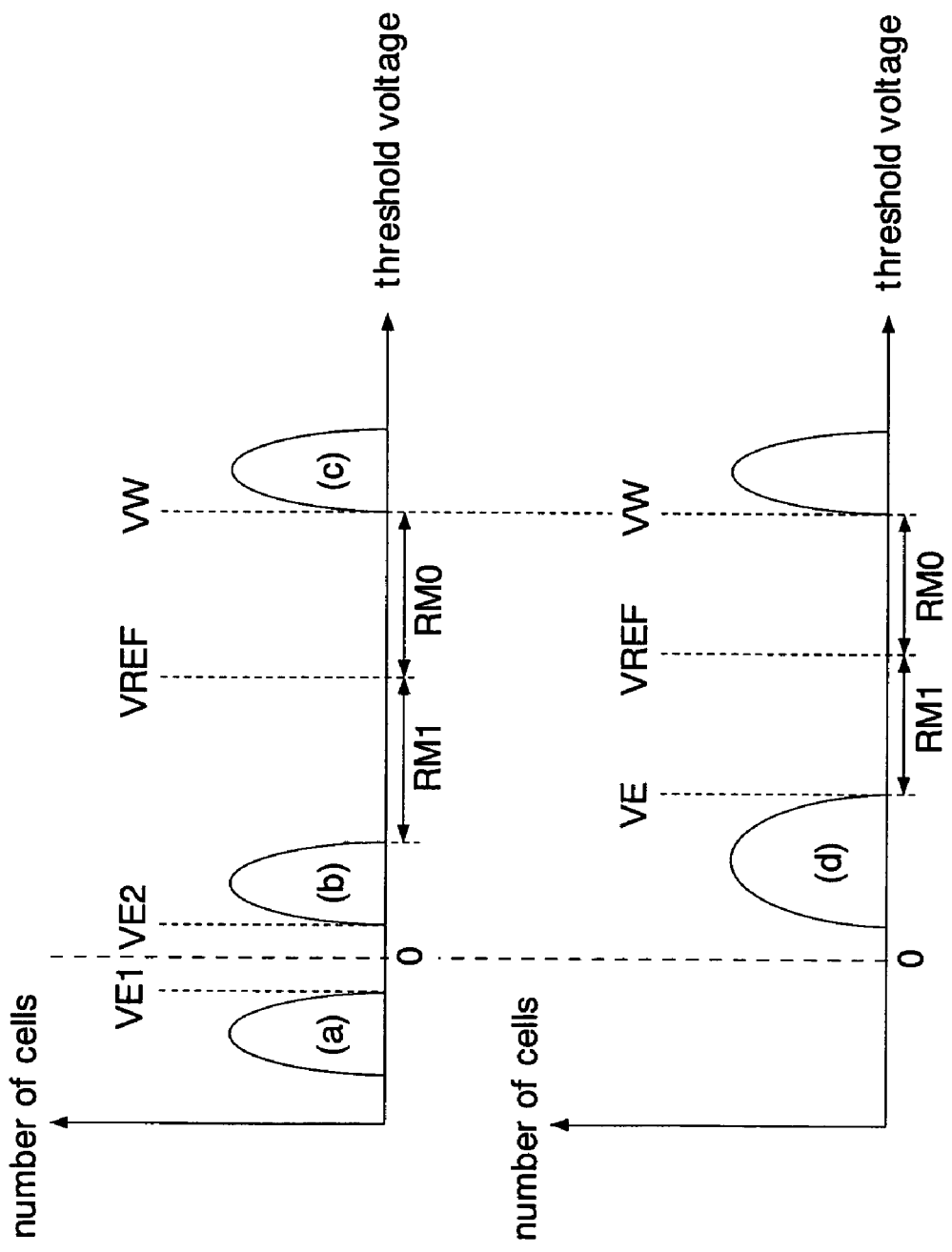
FIG. 6 illustrates threshold voltages of memory cells in an erased state or a written state.

FIG. 6 shows threshold voltages of memory cells MC in an erased state or a written state. The distribution in the top part of the figure corresponds to the case that the invention is applied, and the distribution in the bottom part of the figure corresponds to the case before application of the invention.

In the invention, in an erase operation for writing a logical value "1" to a memory cell MC, first, the erase control circuit 14 shown in FIG. 1 sets the threshold voltage of the memory cell MC at a negative value. More specifically, the threshold voltage of the memory cell MC to be subjected to erasure is set lower than a negative erase verify voltage VE1 (FIG. 6(*a*)). Then, the erase control circuit 14 sets the threshold voltage of the memory cell MC to be subjected to erasure higher than a positive erase verify voltage VE2. As a result, the threshold voltage of the memory cell MC is re-set to a predetermined positive value indicating an erased state (FIG. 6(*b*)).

Since the memory cell transistor is over-erased positively, it is not necessary to cause the memory cell transistor to make a gradual transition to an erased state, that is, what is called stepwise erasure is not necessary. This makes it possible to shorten the erase operation time.

In general, the speed of extraction of electrons from the floating gate FG that utilizes the tunnel effect is low. Further, in the conventional erase operation, to prevent over-erasure, the gate voltage is set low and the voltage is applied plural times in a divisional manner. As a result, the erase operation time is as long as hundreds of milliseconds. According to the invention, the gate voltage can be set higher than in the conventional case by utilizing the over-erasure positively. Therefore, the time necessary for setting the threshold voltage to a negative value is as short as several milliseconds.

In the erase operation according to the invention, the transition of the threshold voltage from a negative value to a positive value is caused by injection of hot electrons into the floating gate FG. In general, the injection rate of hot electrons is as high as several microseconds. Therefore, according to the invention, the erase operation time is as short as several milliseconds.

In a write operation (program operation) for writing a logical value "0" to a memory cell MC, the write control circuit 12 shown in FIG. 1 sets the threshold voltage of the memory cell MC to which data is to be written higher than a write verify voltage VW (FIG. 6(*c*)).

In a read operation, the logical value held in a memory cell MC is judged by comparing a memory cell current flowing between the source and the drain of the memory cell MC with a reference current. In other words, a judgment result "logical value 1" is obtained if the threshold voltage of the memory cell MC is lower than a read reference voltage VREF. A judgment result "logical value 0" is obtained if the threshold voltage of the memory cell MC is higher than the read reference voltage VREF.

A read margin RM1 for the logical value "1" is given by the difference between the maximum value of threshold voltages of erased-state memory cells MC and the read reference voltage VREF. A read margin RM0 for the logical value "0" is given by the difference between the minimum value of threshold voltages of programmed-state memory cells MC and the read reference voltage VREF. In this embodiment, as described later, an optimum threshold voltage can be set for each memory cell MC because data can be erased on the memory cell MC basis. That is, the distribution width of erased-state threshold voltages is small. As a result, the read margins RM1 and RM0 can be increased and incorrect data reading can be prevented.

On the other hand, in an erase operation before application of the invention, the threshold voltage of a memory cell MC to be subjected to erasure is set lower than a positive erase verify voltage VE (FIG. 6(d)). In this case, to prevent over-erasure in which the threshold voltage is set at a negative value, an erase operation is performed so as to be divided into plural operations. As a result, the erase operation time is made longer than in the invention. In flash memories, many memory cells MC are subjected to erasure simultaneously. Therefore, the distribution of erased-state threshold voltages becomes broad. Further, to prevent the minimum value of threshold voltages from having a negative value, it is necessary to set the erase verify voltage VE high. As a result, the maximum value of erased-state threshold voltages is increased and the read margins RM1 and RM0 are decreased.

Figure 7:
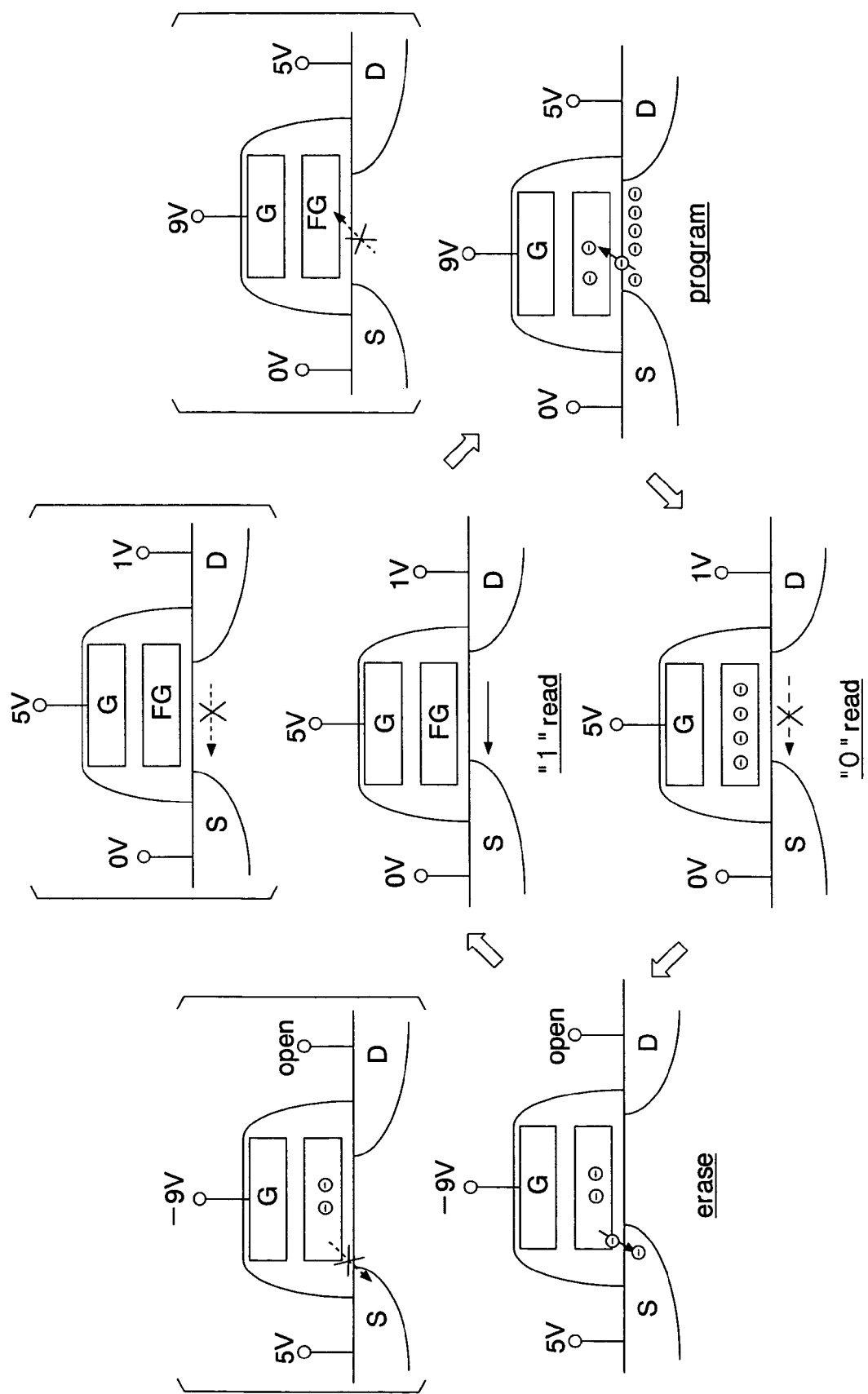
FIG. 7 illustrates an erase operation, a write operation, and a read operation on a memory cell.

FIG. 7 shows an erase operation, a write operation, and a read operation on a memory cell MC.

In an erase operation, the voltages of the control gate G and the source S are set at −9 V and 5 V, respectively. The drain D is rendered in a floating state. A high voltage is applied to an oxide film between the floating gate FG and the source S, whereby electrons in the floating gate FG are extracted into the source S by the tunnel effect. That is, the threshold voltage is lowered.

In a program operation, the voltages of the control gate G, the source S, and the drain D are set at −9 V, 0 V, and 5 V, respectively. High-energy hot electrons are generated by a current flowing between the source S and the drain D and injected into the floating gate FG. That is, the threshold voltage is increased.

In a read operation, the voltages of the control gate G, the source S, and the drain D are set at 5 V, 0 V, and 1 V, respectively. Where the threshold voltage of the memory cell MC is low (reading of a logical value "1"), a current flows between the source S and the drain D. It is judged that a source-drain current is larger than the reference current, whereby a logical value "1" is read out. Where the threshold voltage of the memory cell MC is high (reading of a logical value "0"), no current flows between the source S and the drain D. It is judged that a source-drain current is smaller than the reference current, whereby a logical value "0" is read out.

As parenthesized in the figure, if the structures of the source S and the drain D are interchanged, each operation is not performed normally. That is, the source-drain current has directivity.

FIG. 8 shows voltages that are applied to memory cells MC in an erase operation, a write operation and a read operation. The numeral at the tail of the reference symbol of each memory cell MC indicates the position of the memory cell MC in FIG. 3.

In this example, an erase operation, a write operation, or a read operation is performed on the memory cell M21 which is connected to the word line WL2. The voltages applied to the control gate G, the source S, and the drain D of the memory cell M21 are the same as shown in FIG. 7 (described above).

The memory cells MC20 and MC22 are connected to the same word line WL2 as the memory cell M21 is connected to. Therefore, the same voltage as applied to the control gate G of the memory cell M21 is applied to their control gates G. A voltage between the source S and the drain D of the memory cell M21, M22 are reverse to that between the source S and drain D of the memory cell M20. In this manner, reverse voltages are always applied to the sources S and to the drains D of the pair of memory cells M20 and M21 which are connected to the same word line WL2. The voltage of the drain D of the memory cell M20 is set at the same value as that of the source S of the memory cell M21.

During the erase operation, because of the current directivity, in the memory cell M20 which is connected to the same word line WL2 and the same bit lines BL0 and BL1 as the memory cell MC21 is connected to, electrons in the floating gate FG are not released to the drain D. Therefore, the data of the memory cell MC20 is not erased. That is, data of only one of the pair of memory cells MC20 and MC21 which are connected to the same word line WL2 can be erased. As a result, data can be erased on a memory cell MC basis without the need for increasing the memory cell size.

Both the source S and the drain D of the memory cell MC22 which is connected to the same word line WL2 as the memory cell MC21 is connected to are set at 0 V. In the memory cell MC22, the strength of a source-gate electric field is low. Therefore, electrons in the floating gate FG are not released to the drain D and the data of the memory cell MC22 is not erased. It is noted that erase operations can be performed on both memory cells MC21 and MC22 by setting the voltages of the bit lines BL2 and BL3 at 0 V and 5 V, respectively. The same applies to the memory cells MC23, MC24, . . .

The memory cells MC11, MC31, . . . which are adjacent to the memory cell MC21 in the vertical direction in FIG. 3 are connected to the different word lines WL1, WL3, . . . than the memory cell M21 is connected to. The data of the memory cells MC11, MC31, . . . are not erased because the voltages of the word lines WL1, WL3, . . . are set at 0 V during the erase operation. The same applies to the memory cells MC10, MC30, . . . Therefore, only the data of the memory cell MC21 is erased.

During the program operation, because of the current directivity, in the memory cell M20 which is connected to the same word line WL2 and the same bit lines BL0 and BL1 as the memory cell MC21 is connected to, hot electrons cannot be injected into the floating gate FG from the drain D. Therefore, the memory cell MC20 is not programmed.

Both the source S and the drain D of the memory cell MC22 which is connected to the same word line WL2 as the memory cell MC21 is connected to are set at 0 V. Therefore, hot electrons are not injected into the floating gate FG from the drain D and hence the memory cell MC22 is not programmed. Therefore, data is written to only the memory cell M21. It is noted that write operations can be performed on both memory cells MC21 and MC22 by setting the voltages of the bit lines BL2 and BL3 at 5 V and 0 V, respectively. The same applies to the memory cells MC23, MC24, . . .

The memory cells MC11, MC31, . . . which are adjacent to the memory cell MC21 in the vertical direction in FIG. 3 are connected to the different word lines WL1, WL3, . . . than the memory cell M21 is connected to. The memory cells MC11, MC31, . . . are not programmed because the voltages of the word lines WL1, WL3, . . . are set at 0 V during the program operation. The same applies to the memory cells MC10, MC30, . . .

During the read operation, because of the current directivity, in the memory cell M20 which is connected to the same word line WL2 and the same bit lines BL0 and BL1 as the memory cell MC21 is connected to, no current flows from the source S to the drain D. Therefore, only a memory cell current of the memory cell M21 flows between the bit lines BL0 and BL1. That is, the data of the memory cell M21 is read out correctly.

Both the source S and the drain D of the memory cell MC22 which is connected to the same word line WL2 as the memory cell MC21 is connected to are set at 0 V. Since no memory cell current of the memory cell MC22 flows, data is not read from the memory cell MC22. It is noted that read operations can be performed on both memory cells MC21 and MC22 by setting the voltages of the bit lines BL2 and BL3 at 1 V and 0 V, respectively.

The memory cells MC11, MC31, . . . which are adjacent to the memory cell MC21 in the vertical direction in FIG. 3 are connected to the different word lines WL1, WL3, . . . than the memory cell M21 is connected to. Data are not read from the memory cells MC11, MC31, . . . because the voltages of the word lines WL1, WL3, . . . are set at 0 V during the read operation. The same applies to the memory cells MC10, MC30, . . .

As described above, in this embodiment, the source S of one of a pair of memory cells MC connected to the same word line WL is connected to the drain D of the other, and the drain D of the one memory cell MC is connected to the source S of the other. Each memory cell MC has such directivity that a current is allowed to flow only from the drain D to the source S and charge can be exchanged only on the source S side. During a data rewrite operation, reverse voltages are applied to the sources S and the drains D of the pair of memory cells MC. Because of the directivity of each memory cell MC, charge exchange with the charge accumulation layer is performed only by the source region. Therefore, data can be rewritten on a memory cell MC basis without the need for increasing the memory size.

Since data can be erased on a memory cell MC basis in an erase operation, erased-state threshold voltages can be set at a desired value with high accuracy. The distribution of threshold voltages can be narrowed and hence the read margin can be increased.

Since each pair of bit lines BL are wired in a twisted pair form, data that is read out to one bit line BL can be protected from external noise. Each bit line BL is wired by using first and second wiring layers M1 and M2, and switching between the wiring layers M1 and M2 is made at the drain nodes DND and the source nodes SND. This makes it possible to wire the bit lines BL in a twisted pair form easily and efficiently.

In an erase operation, the threshold voltage of the memory cell MC is set at a negative value and then at a positive value indicating an erased state. Since it is not necessary to lower the threshold voltage of the memory cell MC gradually, the erase operation time can be shortened.

Each memory cell MC can easily be given directivity by forming an offset region between the drain D and the source S.

Figure 9:
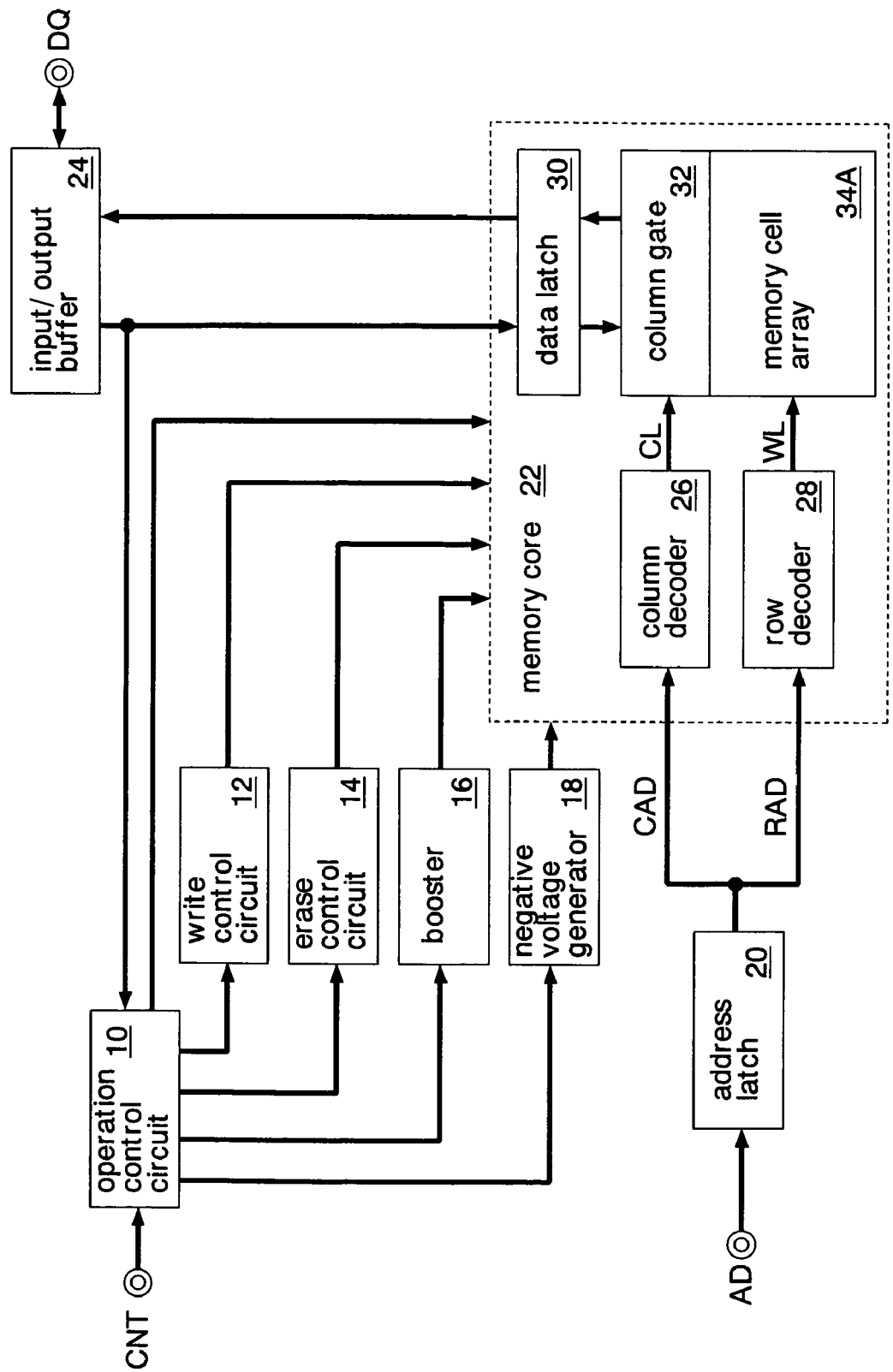
FIG. 9 is a block diagram showing a nonvolatile semiconductor memory according to a second embodiment of the invention.

FIG. 9 shows a nonvolatile semiconductor memory according to a second embodiment of the invention. The same circuits and signals as described in the first embodiment will be given the same symbols and will not be described in detail.

In this embodiment, a memory cell array 34A is formed in place of the memory cell array 34 of the first embodiment. The other part of the configuration is approximately the same as in the first embodiment. That is, this nonvolatile semiconductor memory is a NOR-type EEPROM core that is incorporated in a system LSI.

Figure 10:
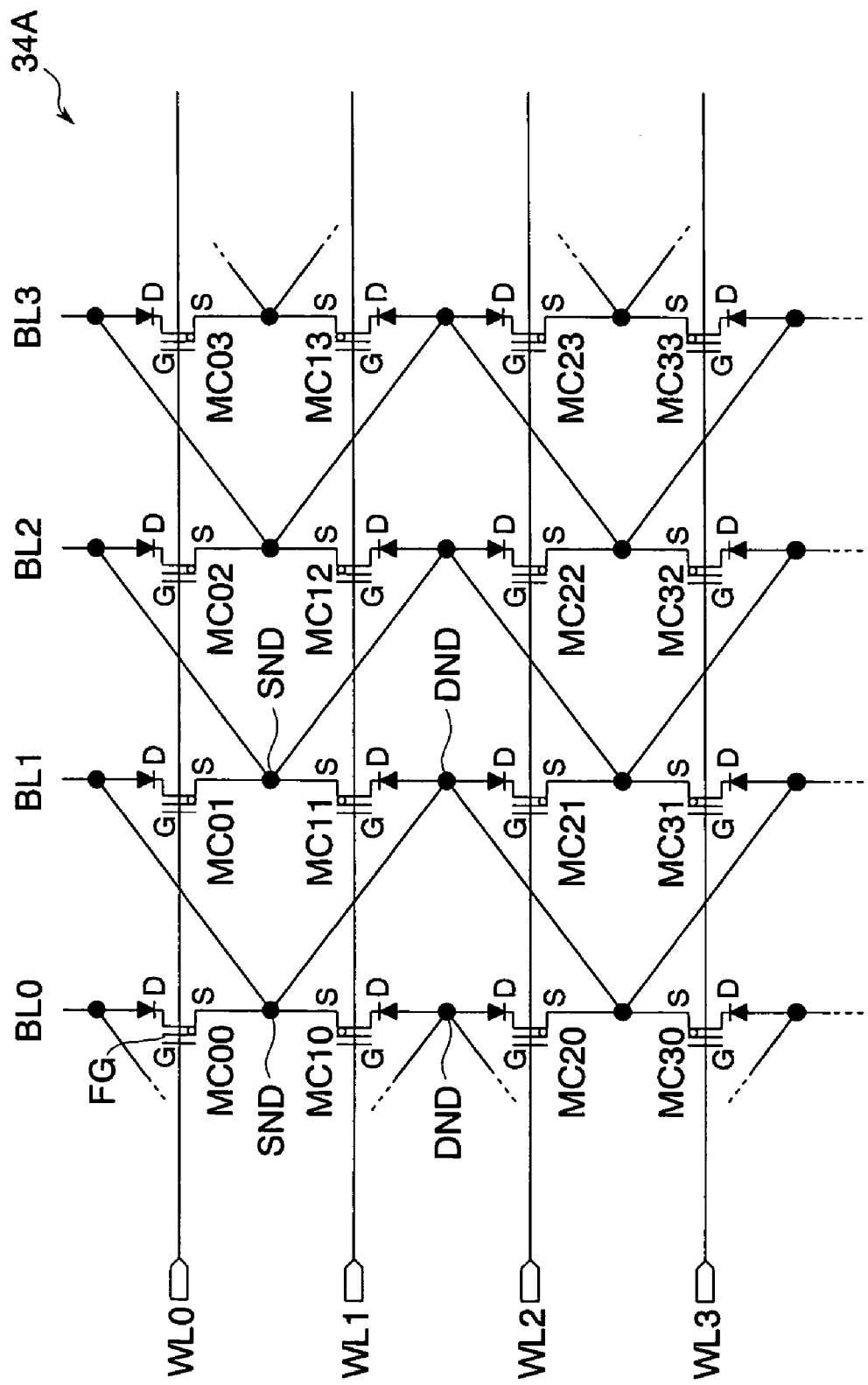
FIG. 10 is a circuit diagram showing the details of a memory cell array shown in FIG. 9.

FIG. 10 shows the details of the memory cell array 34A shown in FIG. 9.

The memory cell array 34A is different from the memory cell array 34 of the first embodiment only in the wiring of bit lines BL. The bit lines BL (BL1, BL2, . . . ) are wired in a zigzag in the vertical direction in the figure. More specifically, the bit line BL1 is connected to the sources S of memory cells MC00, MC10, MC20, . . . that are arranged in the vertical direction in the figure and the drains D of memory cells MC01, MC11, MC21, . . . that are arranged in the vertical direction in the figure. The bit line BL2 is connected to the sources S of the memory cells MC01, MC11, MC21, . . . that are arranged in the vertical direction in the figure and the drains D of the memory cells MC02, MC12, MC22 that are arranged in the vertical direction in the figure. The bit lines BL1, BL2, . . . are wired by using only a first wiring layer.

This embodiment can provide the same advantages as the above-described first embodiment does. Further, by virtue of the zigzagged wiring of the bit lines BL, this embodiment can dispense with the crossing of the bit lines BL. As a result, the bit lines BL can be wired simply by using only the first wiring layer. The number of wiring layers used can be minimized and hence the chip cost of a system LSI incorporating the EEPROM core can be reduced.

Figure 11:
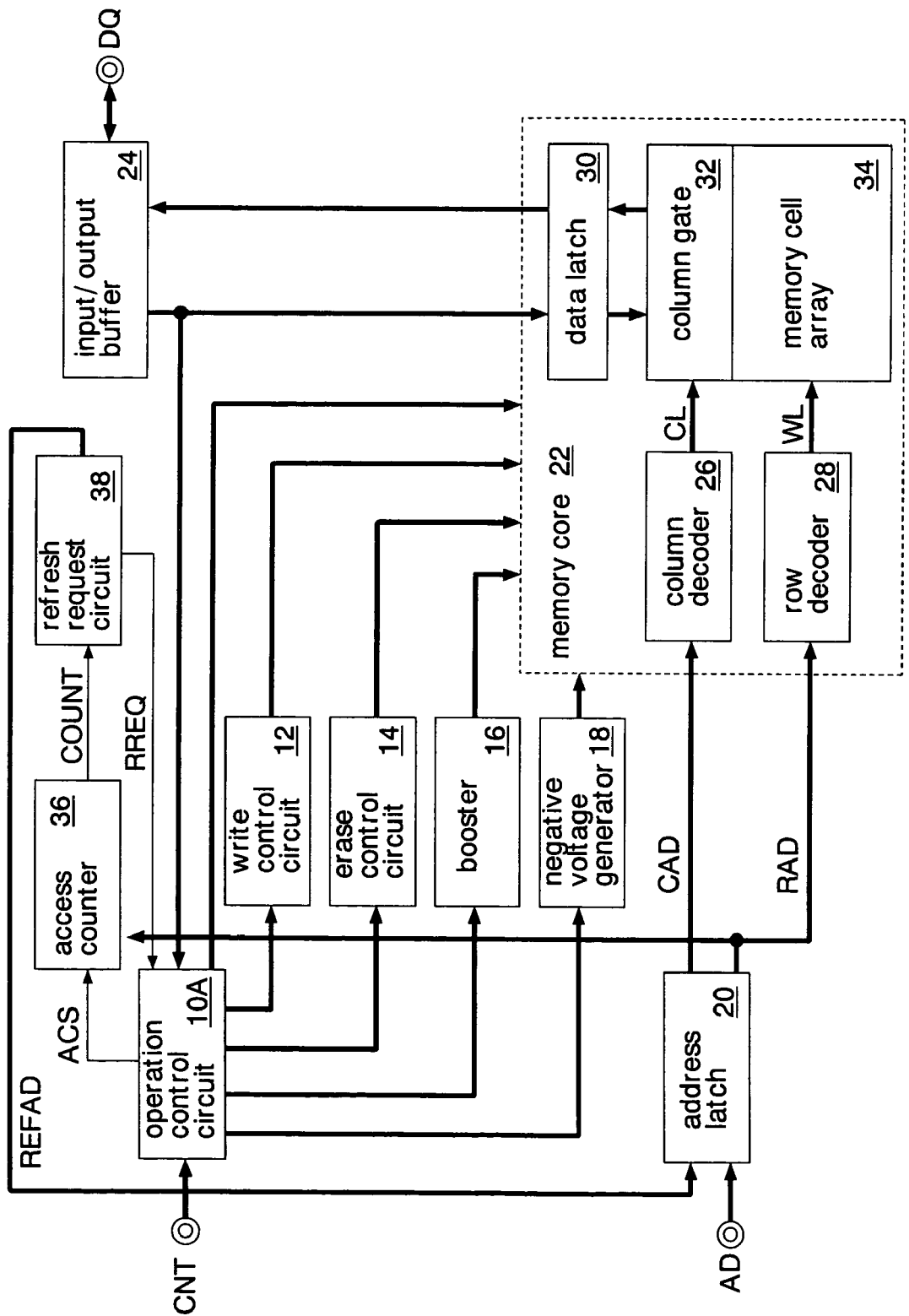
FIG. 11 is a block diagram showing a nonvolatile semiconductor memory according to a third embodiment of the invention.

FIG. 11 shows a nonvolatile semiconductor memory according to a third embodiment of the invention. The same circuits and signals as described in the first embodiment will be given the same symbols and will not be described in detail.

In this embodiment, an operation control circuit 10A is formed in place of the operation control circuit 10 of the first embodiment. An access counter 36 and a refresh request circuit 38 are newly formed. The other part of the configuration is approximately the same as in the first embodiment. That is, this nonvolatile semiconductor memory is a NOR-type EEPROM core that is incorporated in a system LSI.

The operation control circuit 10A has, in addition to the functions of the operation control circuit 10 of the first embodiment, a function of a refresh control circuit that performs a refresh operation in response to a refresh request signal RREQ from the refresh request circuit 38. Further, the operation control circuit 10A outputs an access signal ACS for each erase operation or write operation. The refresh operation is an operation of reading out data held in a memory cell MC and re-writing the read-out data to the same memory cell MC.

The address counter 36 counts, for each row address signal RAD, access signals ACS that have been output from the operation control circuit 10A. A word line WL to be accessed, that is, memory cells MC to be accessed, is recognized by a row address signal RAD. The address counter 36 outputs a counter signal COUNT when each counter value has exceeded a predetermined number. A counter signal COUNT is output for each row address signal RAD.

The refresh request circuit 38 outputs a refresh request signal RREQ and a refresh address signal REFAD in response to a counter signal COUNT. The refresh address signal REFAD is used as a row address signal RAD during a refresh operation. That is, in this embodiment, a refresh operation is performed for each word line WL.

This embodiment can provide the same advantages as the above-described first embodiment does. Further, a refresh operation is performed every time a predetermined number of memory cells MC which are connected to a word line WL have been accessed. This prevents data held in each memory cell MC from being lost due to a disturbance that is caused by an access to an adjacent memory cell MC.

In the invention, an erase operation is performed for each memory cell MC. Therefore, erased-state memory cells MC can be refreshed selectively. That is, a refresh operation can be performed easily. In contrast, in full-ship-erase-type flash memories, the data of programmed memory cells are also erased by an erase operation. This necessitates a large buffer for a refresh operation.

The refresh request circuit 38 issues a refresh request signal RREQ in accordance with the number of times of access to memory cells MC. Performing a refresh operation every predetermined number of times of access can reliably prevent loss of data held in memory cells MC.

The access counter 36 counts the number of times of access to memory cells MC for each word line WL, and the refresh request circuit 38 issues a refresh request signal RREQ. This makes it possible to perform a refresh operation reliably every predetermined number of times of access.

Although the above embodiments are such that the invention is applied to the EEPROM core that is incorporated in a system LSI, the invention is not limited to those embodiments. For example, the invention may be applied to an EEPROM chip.

Although the above embodiments are directed to the case that the current directivity is realized by forming the offset structure between the gate and the drain of each memory cell, the invention is not limited to those embodiments. For example, current directivity may be realized in accordance with the type and the concentration of ions that are implanted into a portion of the drain region that is close to the channel.

In the above-described third embodiment, access signals ACS are counted by the access counter 36 for each row address signal RAD. However, the invention is not limited to this embodiment. For example, access signals ACS may be counted for each row address signal RAD and each column address signal CAD.

The invention is not limited to the above embodiments and various modifications may be made without departing from the spirit and scope of the invention. Any improvement may be made in part or all of the components.

What is claimed is:

1. A nonvolatile semiconductor memory comprising:
   a plurality of nonvolatile memory cell transistors that are arranged in matrix form and have directivities that a current flows from a drain to a source only and that charge is exchangeable only at a source;
   a plurality of word lines that are connected to respective control gate groups of the memory cell transistors that are arranged in one direction;
   a first bit line that is connected to a source of one of a pair of the memory cell transistors and to a drain of the other of the pair of memory cell transistors, said pair of memory cell transistors being adjacent to each other and connected to one of said word lines; and
   a second bit line that is connected to a drain of the one of said pair of memory cell transistors and a source of the other of said pair of memory cell transistors.

2. The nonvolatile semiconductor memory according to claim 1, wherein:
   the memory cell transistors connected to each of said word lines have the drains arranged such that the drains are directed to a same side;
   the memory cell transistors arranged in a direction perpendicular to said word lines have the drains and sources arranged alternately such that the drains and sources are directed to reverse sides; and
   said first and second bit lines are wired in a twisted pair form in a direction perpendicular to said word lines.

3. The nonvolatile semiconductor memory according to claim 2, wherein:
   said first and second bit lines are wired by use of a first wiring layer and a second wiring layer; and
   said first and second wiring layers are switched at a drain node to which drains facing each other are connected and at a source node to which sources facing each other are connected.

4. The nonvolatile semiconductor memory according to claim 1, wherein:
   the memory cell transistors connected to each of said word lines have the drains arranged such that the drains are directed to a same side;
   the memory cell transistors arranged in a direction perpendicular to said word lines have the drains and sources arranged alternately such that the drains and sources are directed to reverse sides; and
   said first and second bit lines are wired in a zigzag in a direction perpendicular to said word lines.

5. The nonvolatile semiconductor memory according to claim 4, wherein
   said first and second bit lines are wired by use of only a first wiring layer.

6. The nonvolatile semiconductor memory according to claim 1, further comprising
   an erase control circuit setting a threshold voltage of the memory cell transistor at a predetermined positive value after setting at a negative value, in an erase operation for erasing data stored in the memory cell transistor, the predetermined positive value indicating an erased state.

7. The nonvolatile semiconductor memory according to claim 1, wherein
   said memory cell transistors have an offset region between said drains and control gates in order to realize said directivities.

8. The nonvolatile semiconductor memory according to claim 1, further comprising
   a refresh control circuit performing, in response to a refresh request, a refresh operation for reading data held in the memory cell transistor and rewriting the read data.

9. The nonvolatile semiconductor memory according to claim 8, further comprising
   a refresh request circuit issuing the refresh request in accordance with a number of times the memory cell transistor is accessed.

10. The nonvolatile semiconductor memory according to claim 9, further comprising
    an access counter counting the number of times the memory cell transistor is accessed.

* * * * *